United States Patent
Shrivastava et al.

(10) Patent No.: US 8,455,947 B2
(45) Date of Patent: Jun. 4, 2013

(54) DEVICE AND METHOD FOR COUPLING FIRST AND SECOND DEVICE PORTIONS

(75) Inventors: Mayank Shrivastava, Mumbai (IN); Cornelius Christian Russ, Diedorf (DE); Harald Gossner, Riemerling (DE); Ramgopal Rao, Mumbai (IN); Maryam Shojaei Baghini, Mumbai (IN)

(73) Assignee: Infineon Technologies AG, Neubiberg (DE)

( * ) Notice: Subject to any disclaimer, the term of this patent is extended or adjusted under 35 U.S.C. 154(b) by 666 days.

(21) Appl. No.: 12/388,479

(22) Filed: Feb. 18, 2009

(65) Prior Publication Data

US 2010/0207161 A1 Aug. 19, 2010

(51) Int. Cl.
*H01L 29/00* (2006.01)

(52) U.S. Cl.
USPC .......................................... 257/336; 257/355

(58) Field of Classification Search
USPC .................. 257/336, 355, E21.437; 438/135
See application file for complete search history.

(56) References Cited

U.S. PATENT DOCUMENTS

| 4,282,556 | A  | * | 8/1981  | Ipri ............................. 361/56 |
| 5,973,382 | A  | * | 10/1999 | Burgener et al. ............. 257/532 |
| 7,173,310 | B2 | * | 2/2007  | Voldman et al. .............. 257/350 |
| 7,638,370 | B2 | * | 12/2009 | Gossner et al. ............... 438/135 |
| 2002/0053704 | A1 | | 5/2002 | Avery et al. |
| 2003/0122192 | A1 | | 7/2003 | Ker et al. |
| 2007/0262386 | A1 | | 11/2007 | Gossner et al. |

FOREIGN PATENT DOCUMENTS

DE 102006022105 B4 3/2012

OTHER PUBLICATIONS

Duvvury, et al., "Design and Layout Requirements", John Wiley & Sons, Ltd., ESD in Silicon Integrated Circuits, 2nd Ed., Ch. 6, 2002, pp. 126-187.
Marichal, et al, , "SCR based ESD protection in nanometer SOI Technologies", EOS/ESD Symposium, ESD Association, 2005, 8 pages.

* cited by examiner

*Primary Examiner* — Long Pham
*Assistant Examiner* — Steven Rao
(74) *Attorney, Agent, or Firm* — Lee & Hayes, PLLC

(57) ABSTRACT

This disclosure relates to devices and methods relating to coupled first and second device portions.

21 Claims, 13 Drawing Sheets

US 8,455,947 B2

DEVICE AND METHOD FOR COUPLING FIRST AND SECOND DEVICE PORTIONS

BACKGROUND

Generally, electrostatic discharge (ESD) protection elements are installed at any input/output (I/O) and supply pad of an integrated circuit (IC) to protect against damage due to electrostatic discharge. These protection elements have to turn on immediately when a discharge occurs and have to limit the voltage overshoot efficiently. At the same time, these protection elements should not be damaged by the discharge itself, which forces several amps through the I/O and protection devices.

A well-known protection element is the (semiconductor) silicon controlled rectifier (SCR). The SCR consists of n+ and p+ contact areas and two attached lightly doped p and n areas between. While SCRs are very robust concerning the discharge current and allow a low voltage clamping at high current levels, there is typically a challenge to achieve a trigger voltage sufficiently low to protect the associated circuit.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques that may be utilized to couple a first device portion and a second device portion for use in ESD protection or other suitable functionality. According to one implementation, a device having a first device portion and a second device portion may be used for ESD protection and may have an integrated or incorporated (semiconductor) silicon controlled rectifier (SCR) functionality. According to one implementation, the first device portion may be a bipolar device portion, the second portion may be a Metal Oxide Semiconductor (MOS) Field Effect Transistor (FET) device portion, and a base region of the bipolar device portion may be coupled with a drain region of the MOSFET device portion to thereby form an isolated gate bipolar transistor (IGBT) device having an integrated SCR extending from the source of the MOSFET device portion to the emitter of the bipolar device portion.

The techniques described herein may be implemented in a number of ways. Exemplary environments and context are provided below with reference to the included figures and on going discussion. The implementations described below are meant to serve only as non-limiting examples. For example, the discussion below describes in part devices that couple one or more NMOSFET (also referred to herein as simply "NMOS") device portions with one or more PNP bipolar device portions. It will be readily appreciated by one skilled in the art that these exemplary implementations could also be implemented as one or more PMOSFET (also referred to herein as simply "PMOS") device portions coupled with one or more NPN bipolar device portions.

Exemplary Devices

Figure 1A:
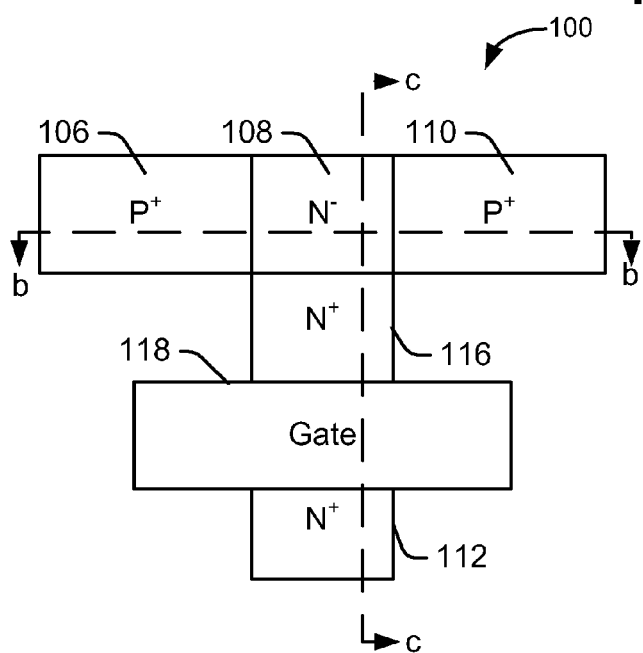
FIGS. 1A-C are schematic diagrams of a device having a first device portion and a second device portion, the device configured to perform a (semiconductor) silicon controlled rectifier (SCR) function.
Figure 1C:
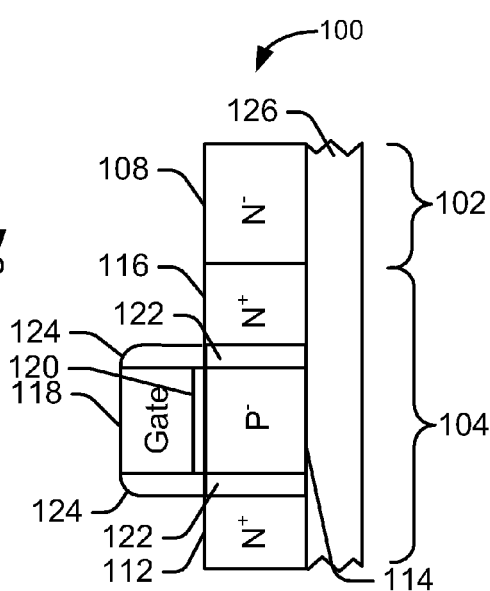
Figure 1B:
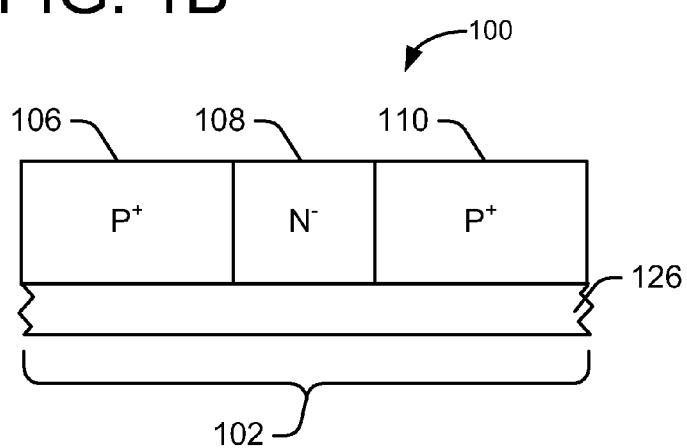

FIGS. 1A-C illustrate one implementation of a device 100, which may be used for ESD protection or other suitable purpose. FIG. 1A shows a top view of device 100. FIG. 1B shows a cutaway view along line bb. FIG. 1C shows a cutaway view along line cc.

According to the implementation shown in FIGS. 1A-C, the device 100 includes a first portion 102 and a second portion 104. The first portion 102 has a doped first region 106, a doped second region 108 and doped third region 110. According to the example shown, the doped first region 106 is p⁺ doped and may be configured to operate as an emitter of a bipolar device. The doped second region 108 is n⁻ doped and may be configured to operate as a base of the bipolar device. The third region 110 is p⁺ doped and may be configured to operate as a collector of the bipolar device. Thus, the first portion 102 may be operated as a PNP bipolar transistor device. As one skilled in the art will readily appreciate, the first and third region my alternatively be configured to operate as the collector and emitter, respectively.

The second portion 104 of the device 100 includes a doped first region 112, a doped second region 114, and a doped third region 116. The doped first region 112 may be n+ doped and may be configured to operate as a source region of an NMOS device. The second region 114 may be p⁻ doped and may be configured to operate as a channel region of the NMOS device. The third region 116 may be n+ doped and may be configured to operate as a drain region of the NMOS device. A patterned gate layer 118 may be formed overlying a patterned gate dielectric layer 120 and the doped second region 114 to control the NMOS device in the second portion 104. Other device features, such as lightly doped regions 122 and spacers 124, may also be included as part of the NMOS device portion in the second portion 104.

The second region 108 of the first device portion 102 (e.g., the base region of the PNP bipolar transistor) may be coupled to the third region 116 of the second device portion 104 (e.g., the drain region of the NMOS device). In this manner, the device 100 may function as an Isolated Gate Bipolar Transistor (IGBT) device with an incorporated SCR function. This functionality is due to the NMOS transistor device in second device portion 104 being configured to trigger the pnp bipolar transistor in the first device portion 102 and provide a silicon controlled rectifier (SCR) function through the NPNP configuration of regions 112, 114, 116, 108, and 106 (or 110). The operation of the NMOS may be controlled by external RC control circuit (when used under ESD condition), according to known techniques in the art. The IGBT configuration of device 100 permits fast triggering of the entire device 100 and low transient overshoots, when used under electrostatic discharge (ESD) conditions. The combination of the IGBT device and SCR functions may additionally provide a low holding voltage. A major portion of the ESD current may be sunk by the PNP device and the rest by the parallel SCR, which eventually leads to a high failure threshold.

The device 100 may be implemented according to bulk processing, silicon on insulator (SOI), or Multigate FET (MuGFET) techniques. FIGS. 1A-C illustrate one implementation in which the device 100 is formed in a silicon layer that has been disposed upon an insulating material layer 126, such as an oxide or nitride layer (i.e. according to commonly referred to Silicon-on-Insulator or SOI techniques). The first portion 102 and the second portion 104 may be formed, deposited, or grown on the surface of the insulating material layer 126. The insulating material layer 126 may be formed over a silicon material layer or substrate, which is not shown for the sake of simplicity, but which is well known in the SOI and MuGFET arts. The device 100 may alternatively be formed in bulk semiconductor according to known techniques including well-implantation.

Figure 2:
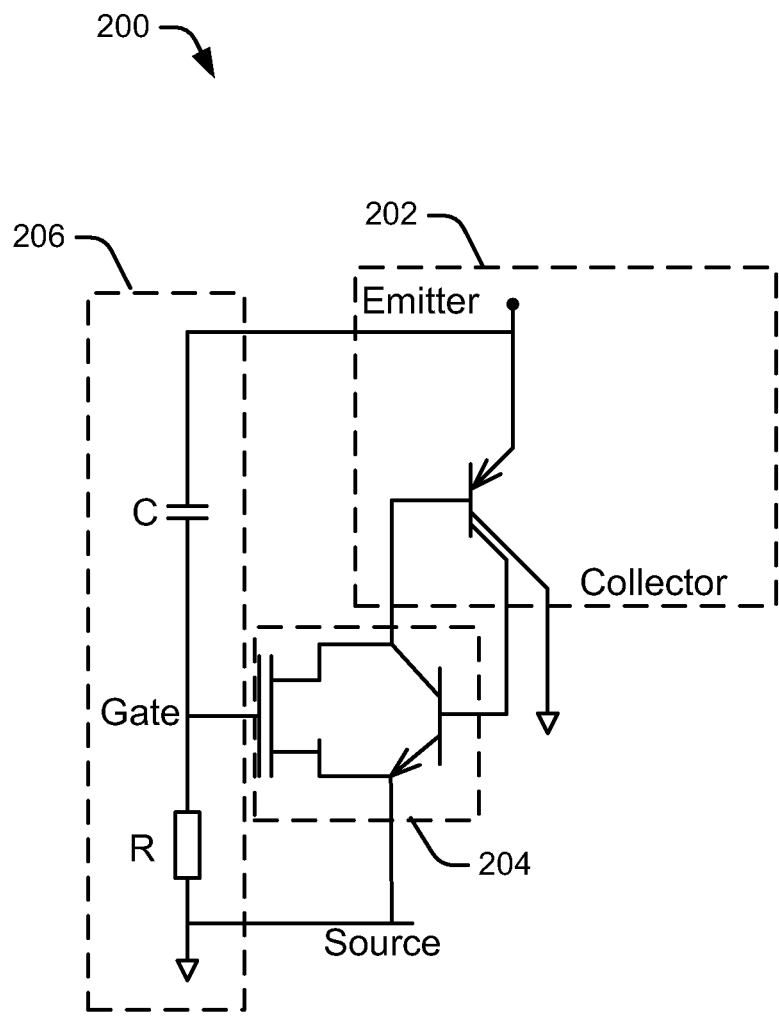
FIG. 2 is a circuit diagram of an exemplary circuit layout for coupling a first device portion to a second device portion.

FIG. 2 shows one exemplary circuit 200, which illustrates the circuit layout and operation of a device 200 that may be similar or identical to the device 100. A PNP bipolar device portion 202 (which may correspond to the first device portion 102) is coupled to a NMOSFET portion 204 (which may correspond to the second device portion 104). An RC component 206, having one or more resistors R and one or more capacitors C, may be implemented as an external or integral component to device 200, and controls the NMOSFET device portion 204 to thereby trigger the PNP bipolar device portion 202.

Figure 3:
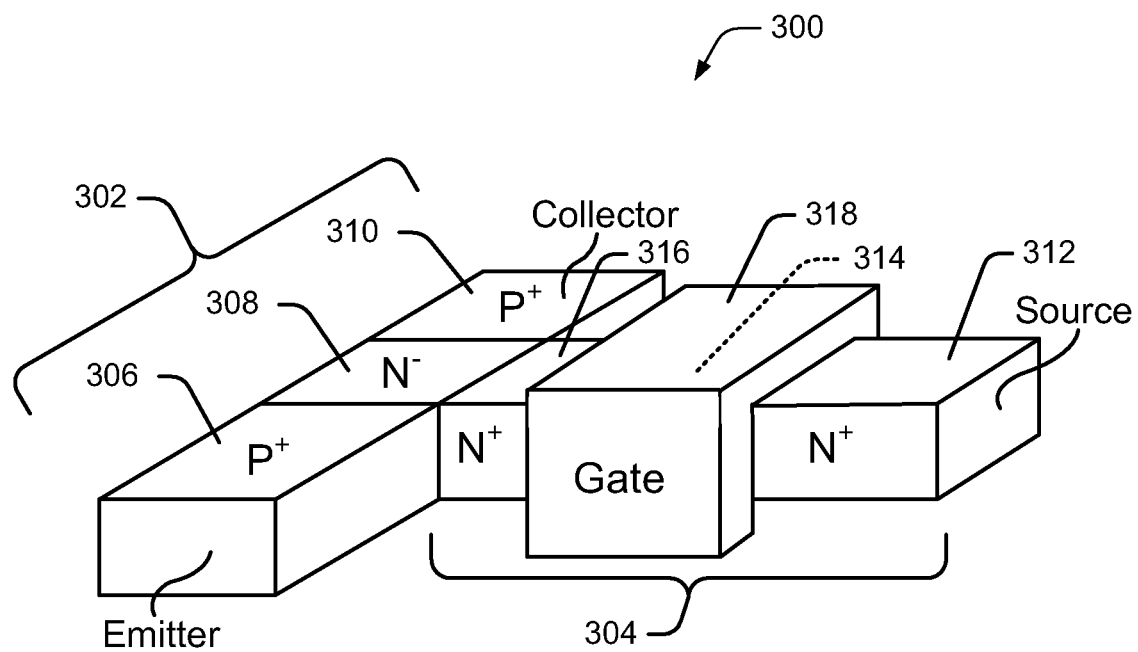
FIG. 3 is an isometric schematic diagram of the implementation shown in FIG. 1, when implemented as a FinFET device.

FIG. 3 shows the device 100 of FIG. 1 implemented as a FinFET-type device 300, where a PNP bipolar device portion 302 generally corresponds to the first portion 102 and an NMOS device portion 304 generally corresponds to the second portion 104. According to this implementation, a gate 318 wraps around the second region 314 (shown as underlying by dashed "call-out" line) of the NMOS portion 304, which may extend from a substrate as a FinFET-type device. Although the process is described with respect to a FinFET, the concept may be generally applied using any fin-based, multigate transistor architecture regardless of number of gates (e.g. tri-gate transistors, Gate-all-around FET (GAA FET), Multi-Gate FET (MuGFET), and so forth).

Figure 4A:
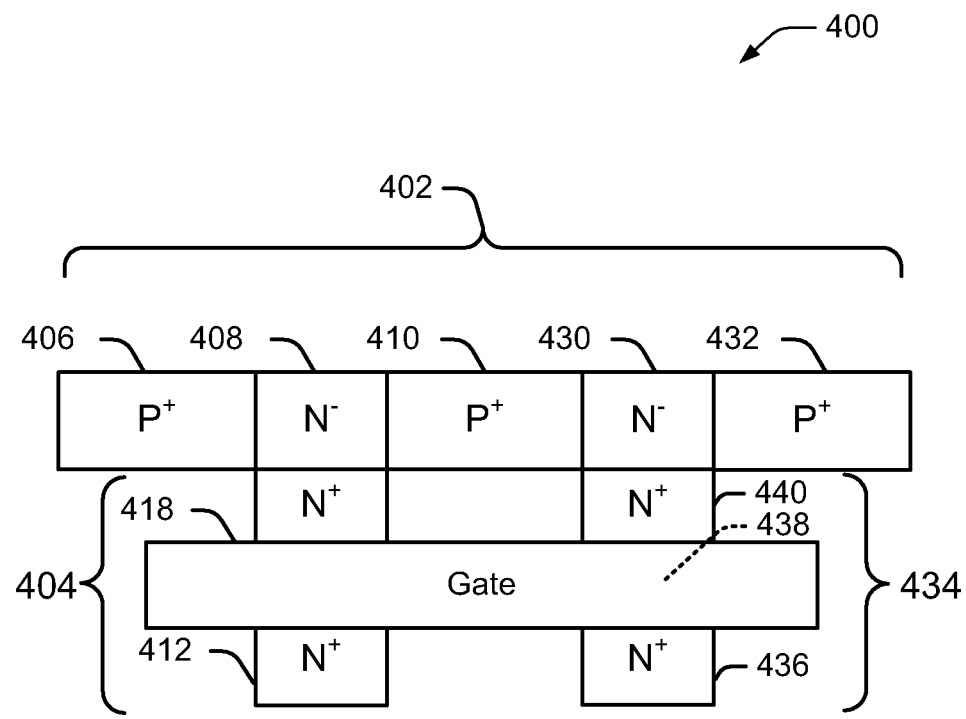
FIG. 4A is a schematic diagram of an implementation having multiple NMOS device portions coupled to a bipolar device portion.

FIG. 4A shows an implementation of a device 400, which may include multiple device portions 404 and 434 coupled to a first device portion 402 of the device 400. The first device region 402 may be similar to first device region 102, except that first device portion 402 has (in addition to the doped first region 406, the doped second region 408, and the doped third region 410) a doped fourth region 430, which may be configured to operate as a base region, and a doped fifth region 432, which may be configured to operate as an emitter region. Thus, doped first region 406 may be electrically coupled to doped fifth region 432 by a wiring layer, which is not shown for the sake of simplicity.

The device 400 further includes a third device portion 434, which includes a doped first region 436, a doped second region 438 (shown as underlying the gate by dashed "call-out" line), and a doped third region 440. Like the second device portion 404 (and second device portion 104), the third device portion 434 may be configured as a field effect transistor (FET) device. Also similar to second device portion 404, the third device portion 434 may be coupled to the first device portion 402. According to the configuration shown, the doped third region 440 of the third portion 434 is coupled to the doped fourth region 430 of the first device portion 402. The second device portion 404 and the third device portion 434 may be operated as NMOS transistors using independent or commonly coupled separate gates (not shown) or by a common gate 418. Although the device is shown with two NMOS devices (i.e. 404 and 434), additional NMOS devices, n⁻ regions (similar to doped fourth region 430), and p⁺ regions (similar to doped first or third or fifth regions 406, 410, 432) could be similarly added to create an array of NMOS devices, each NMOS device having a drain that is coupled to one of a plurality of base regions (408, 430, and so forth) of a PNP type bipolar device portion 402.

According to one implementation of the device 400, the first device portion consists of a series of p⁺ doped regions (e.g., 406, 410, and 432), in which every other p⁺ doped region is an emitter (e.g. 406 and 432) or a collector (e.g., 410) in an alternating fashion. The regions configured to operate in one manner (e.g. i.e. the emitter regions 406 and 432) may be coupled together or may be independently controlled. For example, region 406 may be electrically coupled to region 432, while region 410 may be connected to other regions (not shown for the sake of simplicity) configured to operate as collectors. Alternatively, two or more bipolar device portions may be "stacked", i.e. connected electrically in series. According to this example, region 406 is operated as an emitter, region 408 as a base, and region 410 as a collector of a first bipolar device. However, region 410 is not externally connected. Instead, region 410 is operated as a collector relative to base 408 and as an emitter relative to base 430. The region 432 is operated as the collector relative to base 430 and may be operated as the emitter for the next base (not shown for the sake of simplicity), and so forth. Thus, the first device portion (shown as device portion 402, with five doped regions as an example) may be operated as a plurality of serially connected bipolar devices in which the same doped region may be operated as the emitter for one bipolar device and as the collector for the adjacent, serially connected, bipolar device.

Figure 4B:
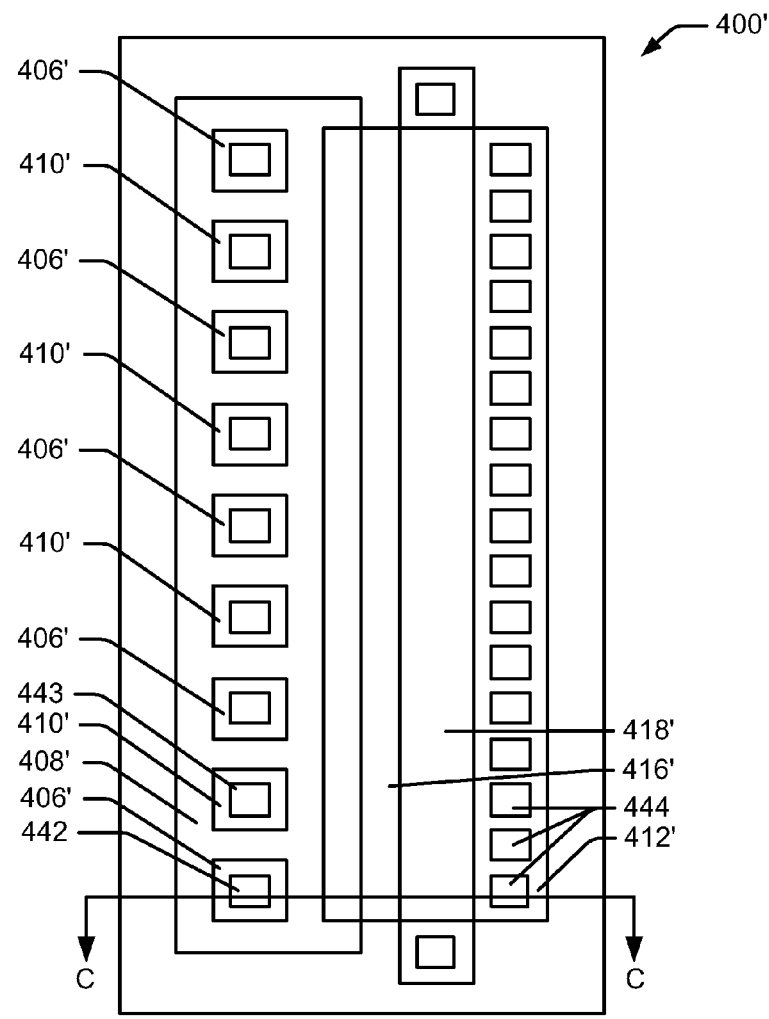
FIGS. 4B and 4C are schematic diagrams of an implementation using CMOS bulk processing techniques with alternating emitter regions and collector regions.
Figure 4C:
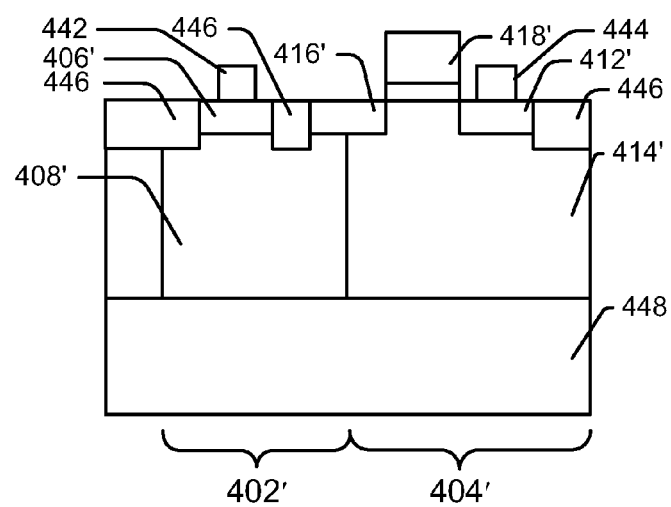

FIGS. 4B-4C show a device 400', which may be generally operated similar to device 400, but may be implemented using CMOS bulk processing techniques. FIG. 4C shows a cutaway view along line cc of FIG. 4B. The "'" is used in combination with reference numerals in these figures to denote that these portions or regions may be similar or identical to other portions or regions having similar reference numbers.

As with device 400, device 400' has two device portions 402' and 404'. The first device portion 402' has a doped second region 408' that is configured to operate as a base of a bipolar device. The first portion 402' also has one or more doped first regions 406' and one or more doped third regions 410', wherein one of the regions is configured to operate as a collector and the other region is configured to operate as an emitter. Thus, for example, regions 406' may be configured to operate as emitters, regions 410' may be configured to operate as collectors, or vice versa. Contacts 442 provide a signal to the one or more doped first regions 406'; contacts 443 provide a signal to the one or more doped third regions 410'.

The second device portion 404' includes a doped first region 412', configured to operate as a source, a doped second region 414', configured to operate as a channel, and a doped third region 416', configured to operate as a drain of a FET device. One or more contacts 444 may be provided to supply a signal to the doped first region 412'. A gate 418' may be provided to control the FET device formed in the second portion 404'. The doped third region 416' is configured to drive the doped second region 408'. Shallow trench isolation (STI) regions 446 may otherwise isolate the bipolar device of the first device portion 402' from the FET device of second device portion 404', as well as from other devices (not shown) that may be formed in the semiconductor substrate 448.

Figure 4D:
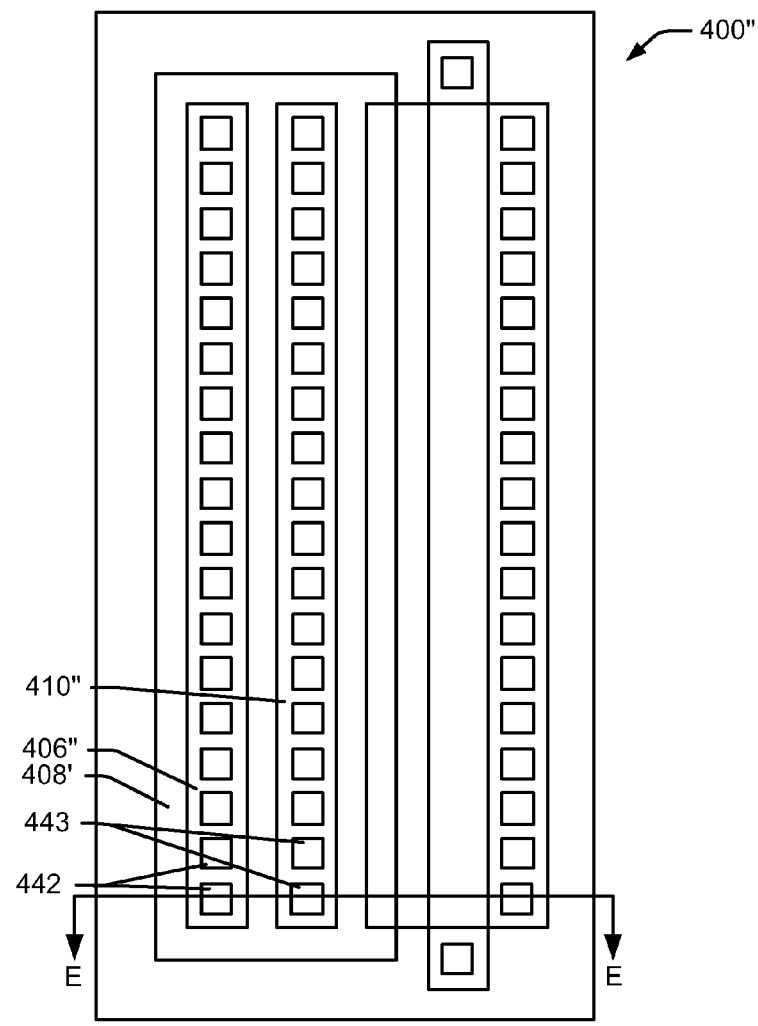
FIGS. 4D and 4E are schematic diagrams of an implementation using CMOS bulk processing techniques with common emitter regions and common collector regions.
Figure 4E:
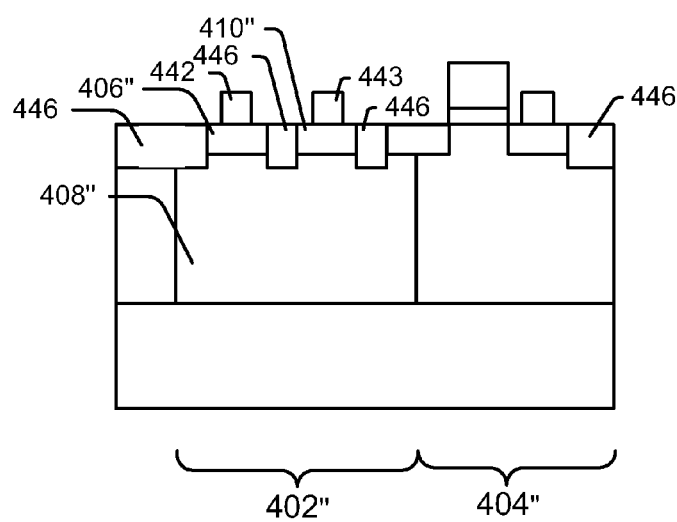

FIGS. 4D and 4E show a device 400". More particularly, FIG. 4E shows a cutaway view along line EE of FIG. 4D. Like device 400', device 400" has a first device portion 402" and a second device portion 404". The second device portion 404" may be similar or identical to the second device portion 404' and, thus, further discussion is unnecessary. The first device portion 402", however, is configured in a different manner to device portion 402'.

The first device portion 402" has a doped second region 408" that is configured to operate as a base of a bipolar device. The first portion 402" also has one (or more) doped first region(s) 406" and one (or more) doped third region(s) 410", wherein one of the regions is configured to operate as one (or more) collector(s) and the other region is configured to operate as one (or more) emitter(s). For example, region 406" may be configured to operate as one (or more) emitter(s), region 410" may be configured to operate as one (or more) collector(s), or vice versa. Contacts 442 and 443 may provide signals to the doped first region 406" and the doped third region 410", respectively. Thus, signals may be provided through contacts 442 and 443 to the one (or more) emitter(s) and to the one (or more) collector(s), which are formed opposite the one (or more) emitter(s) (i.e. not in the alternating configuration as shown in FIGS. 4B and 4C).

Figure 5:
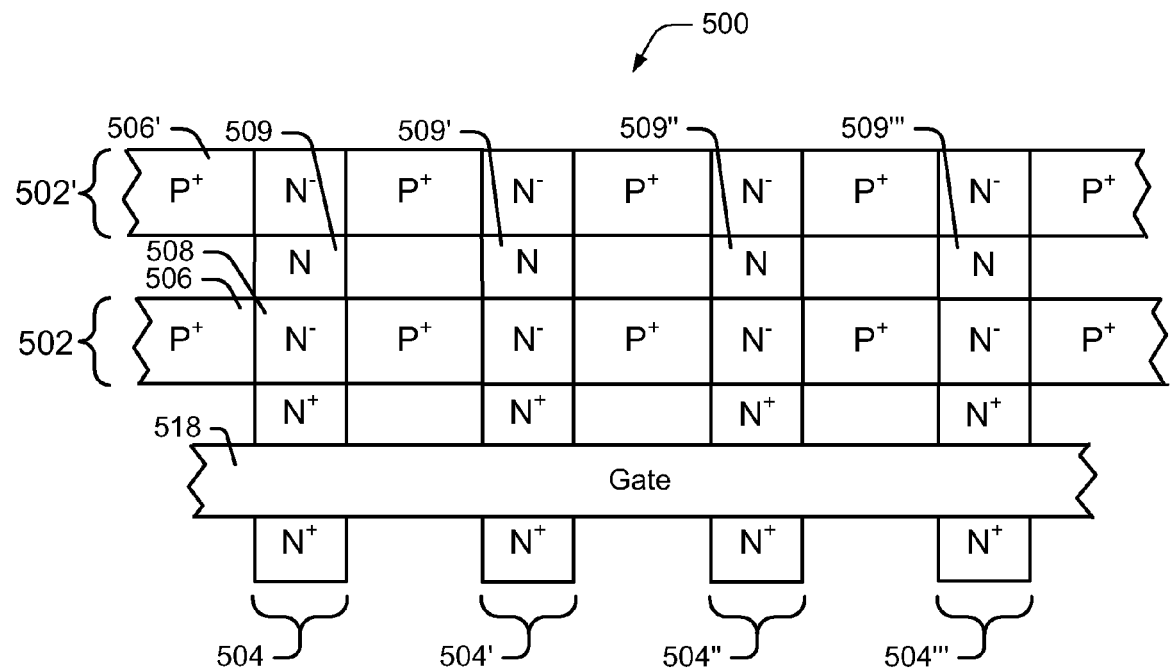
FIG. 5 is a schematic diagram of an implementation having multiple NMOS device portions coupled to multiple bipolar device portions.

FIG. 5 shows an implementation of a device 500, which may include multiple NMOS device portions coupled to multiple bipolar device portions. For example, NMOS device portions 504, 504', 504", and 504''' may be coupled to PNP bipolar device portion 502, which may be coupled, via n connection regions 509, 509', 509", and 509''', (which may be lightly, moderately or heavily doped) to bipolar device portion 502'. The "'" is used in combination with reference numerals in this figure to denote that these portions or regions may be similar or identical to other portions or regions having a similar reference number. Thus, device 500 forms an array for a protection device using a row of NMOS device portions (i.e. device portions 504, 504', 504", and 504''') coupled to a plurality of PNP bipolar device portions 502, 502', and so forth. The layout area of this configuration may reduce the overall parasitics of the device 500 or of the system in which device 500 is implemented. The general pattern shown in FIG. 5 may be repeated to include additional PNP bipolar device portions (e.g. 502, 502') and/or additional NMOS portions (e.g. 504, 504', and so forth). Common regions such as the emitter regions 506 and 506' may be electrically coupled by a wiring layer, which is not shown for the sake of simplicity. Moreover, the device portions 504, 504', and so forth, may be operated as NMOS transistors using independent or commonly coupled separate gates (not shown) or by a common gate 518.

Figure 6:
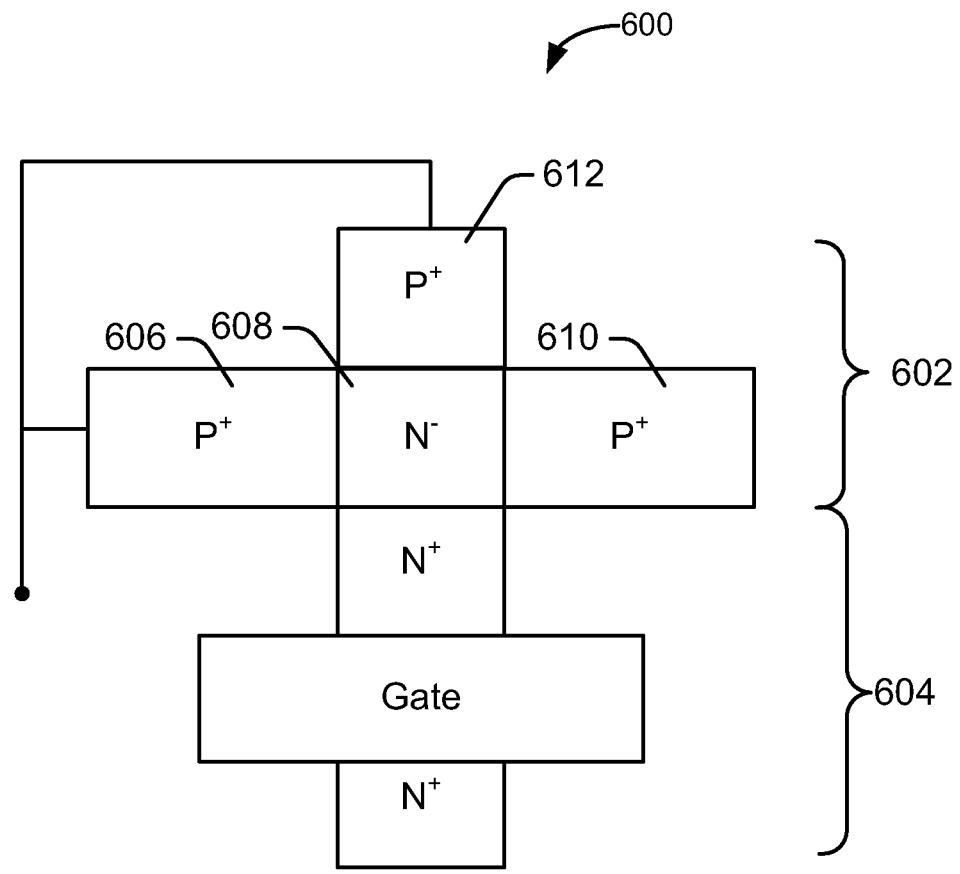
FIG. 6 is a schematic diagram of an implementation in which the bipolar device portion is configured with more than one emitter region.

FIG. 6 shows an implementation of a device 600, which may include a bipolar device portion 602 coupled to an NMOS device portion 604. The NMOS device portion 604 may be similar or identical to the second portion 104. The bipolar device portion 602 may be similar to the first device portion 102 in that bipolar device portion 602 has a first region 606, which may be operated as an emitter region, a doped second region 608, which may be operated as a base region, and a doped third region 610, which may be operated as a collector region. However, the bipolar device portion 602 may additionally have a doped fourth region 612, which may be configured to operate as a second emitter. According to this implementation, a higher emitter injection may be achieved. Alternatively, the doped fourth region 612 may be configured to operate as a second collector. Moreover, it should be appreciated that, although only a single device 600 is shown, the device 600 may be configured as part of an array, similar to device 400, each base 608 having an adjacent second region 612 operated as an emitter or collector.

Figure 7:
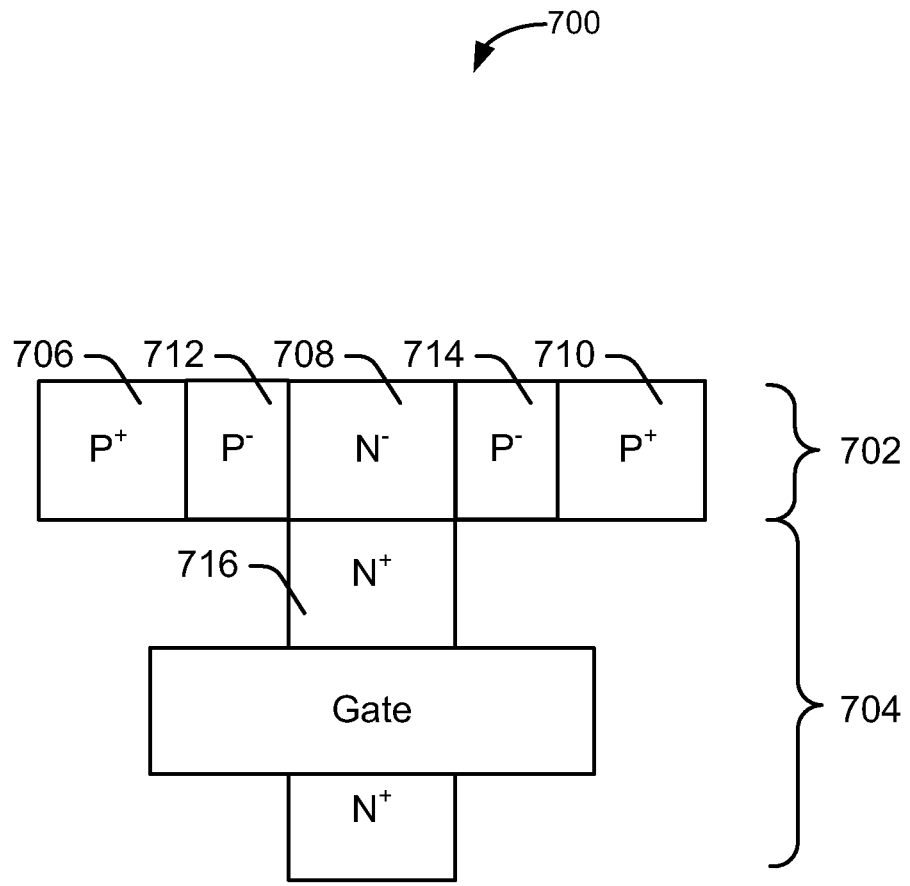
FIG. 7 is a schematic diagram of an implementation of an NMOS device portion coupled to a bipolar device portion in which the bipolar device portion is configured with one or more lightly doped regions between the emitter and the base or the base and collector.

FIG. 7 shows an implementation of a device 700, which may include a bipolar device portion 702 coupled to an NMOS device portion 704. The NMOS device portion 704 may be similar or identical to the second portion 104. The bipolar device portion 702 may be similar to the first device portion 102 in that bipolar device portion 702 has a doped first region 706, which may be operated as an emitter region, a doped second region 708, which may be operated as a base region, and a doped third region 710, which may be operated as a collector region. However, the bipolar device portion 702 may additionally have doped region 712 between the base region and the emitter region and/or doped region 714 between the base region and the collector region, which may be less doped (but of the same doping type) than the emitter and collector regions 706 and 710. According to this implementation, current that might otherwise leak between, for example, the doped third region 710 (or the doped first region 706) in device portion 702 and the doped third region 716 in device portion 704 may be reduced. Moreover, it should be appreciated that, although only a single device 700 is shown, the device 700 may be configured as part of an array, similar to device 400 or 500, but with each base having one or more adjacent lightly doped region(s).

Figure 8:
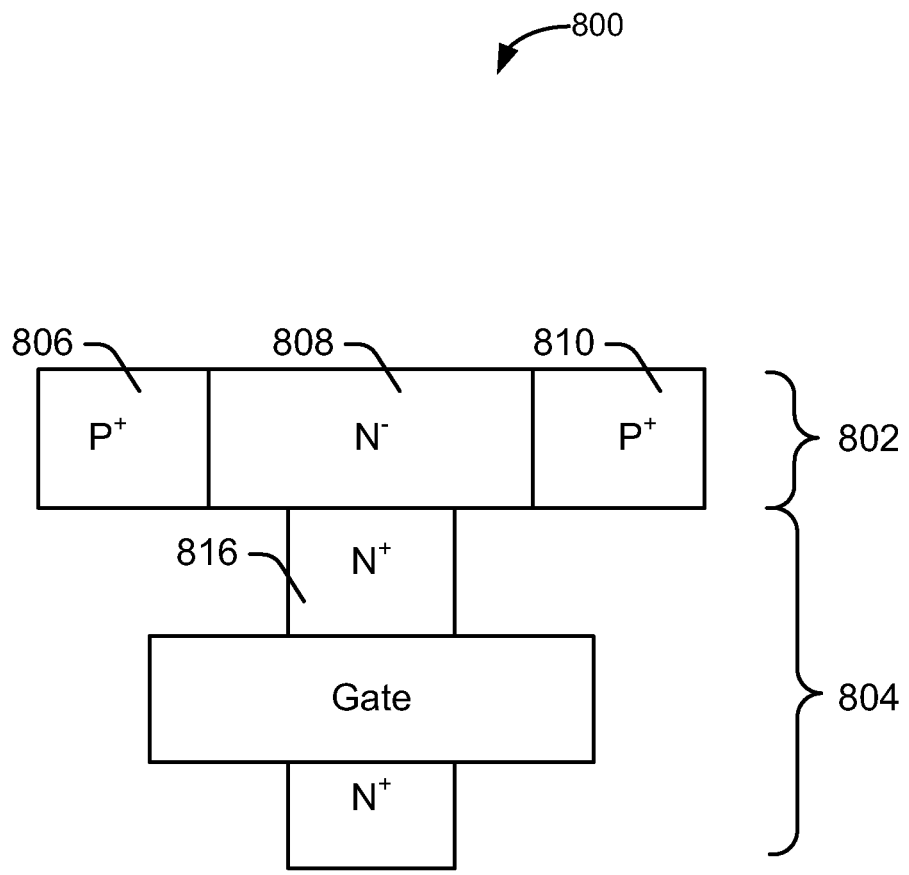
FIG. 8 is a schematic diagram of an implementation of an NMOS device portion coupled to a bipolar device portion in which the base of bipolar device portion has a surface that extends beyond a surface of the drain of the NMOS device portion.

FIG. 8 shows an implementation of a device 800, which may include a bipolar device portion 802 coupled to an NMOS device portion 804. The NMOS device portion 804 may be similar or identical to the second portion 104. The bipolar device portion 802 may be similar to the first device portion 102 in that bipolar device portion 802 has a doped first region 806, which may be operated as an emitter region, a doped second region 808, which may be operated as a base region, and a doped third region 810, which may be operated as a collector region. However, the base region (i.e. doped second region 808) of bipolar device portion 802 has a surface that extends beyond a surface of the drain region (i.e. doped third region 816) of the NMOS device portion 804. According to this implementation, current that might otherwise leak between, for example, the doped third region 810 (or the doped first region 806) in device portion 802 and the doped third region 816 in device portion 804 may be reduced. It should be appreciated that, although only a single device 800 is shown, the device 800 may be configured as part of an array, similar to device 400 or 500, but with each base having a surface that extends beyond a surface of an adjacent drain region.

Figure 9:
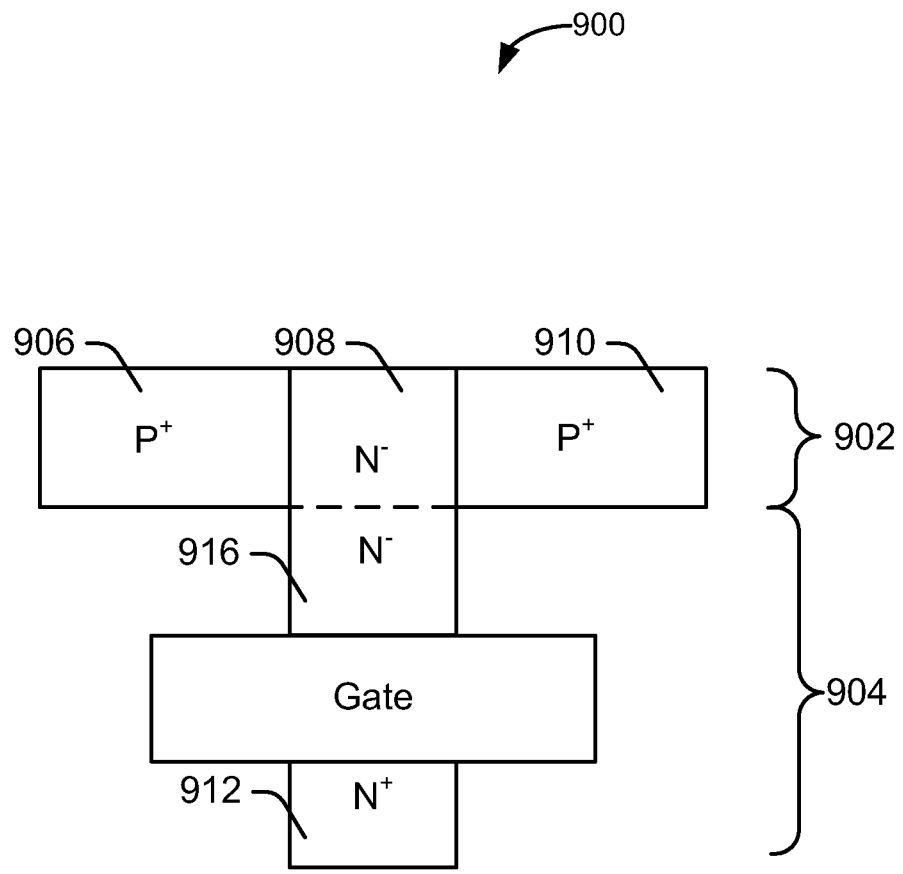
FIG. 9 is a schematic diagram of an implementation of an NMOS device portion coupled to a bipolar device portion in which the base region of the bipolar device portion extends toward, replaces, or is doped with the same level (e.g., n⁻) as the third or drain region of the NMOS device portion.

FIG. 9 shows an implementation of a device 900, which may include a bipolar device portion 902 coupled to an NMOS device portion 904. The NMOS device portion 904 may be similar or identical to the second portion 104, but may have the third doped region 916 (which is generally a heavily doped drain region) doped at the same level as the doped second region 908. The bipolar device portion 902 may be similar to the first device portion 102 in that bipolar device portion 902 has a doped first region 906, which may be operated as an emitter, a doped second region 908, which may be operated as a base region, and a doped third region 910, which may be operated as a collector region. However, the doped second region 908 may be elongated, or extend into the second device portion 904. Additionally or alternatively, the doped second region 908 and the doped third region 916 may have the same dopant level, which may be less than the dopant level of the doped first region 912 of the second device portion 904. Thus, the doped second region 908 and the doped third region 916 may be considered a single, extended, region as designated by the dashed line. According to this implementation, current that might otherwise leak between, for example, the doped third region 910 (or the doped first region 906) and the doped third region 916 in device portion 904 may be reduced. It should be appreciated that, although only a single device 900 is shown, the device 900 may be configured as part of an array, similar to device 400 or 500, but with each base region extending toward a gate of an adjacent MOSFET device.

Figure 10A:
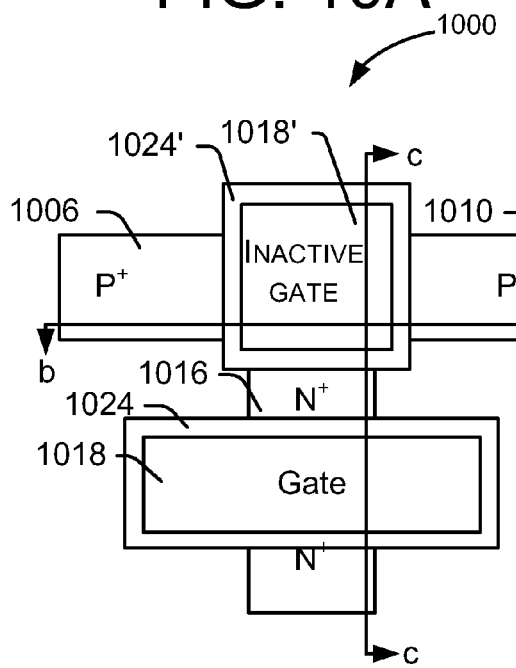
FIGS. 10A-C are schematic diagrams of an implementation of an NMOS device portion coupled to a bipolar device portion in which an inactive gate is formed to separate highly doped regions of the bipolar device portion from highly doped portions of the NMOS device portion.
Figure 10C:
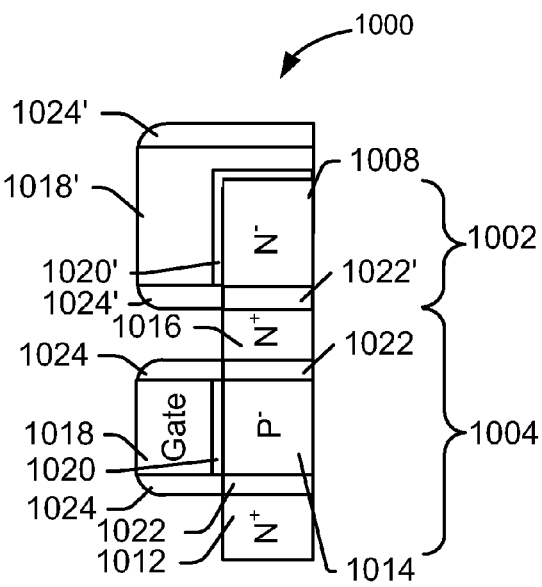
Figure 10B:
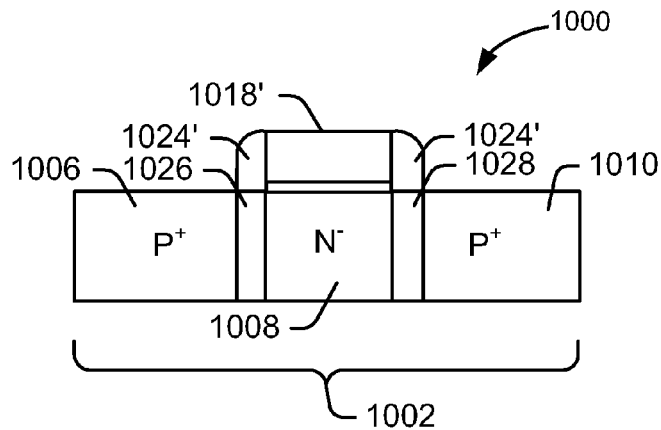

FIGS. 10A-C show an implementation of a device 1000, which may include a bipolar device portion 1002 coupled to an NMOS device portion 1004. The NMOS device portion 1004 may be similar or identical to the second portion 104. Thus, for example, the second device portion 1004 of the device 1000 includes a doped first region 1012, a doped second region 1014, and a doped third region 1016 configured to operate as an NMOS device. A gate 1018 may be formed overlying a gate dielectric 1020 and the doped second region 1014 to control the NMOS device in the second device portion 1004. Other device features, such as lightly doped regions 1022 and spacers 1024, may also be included in the NMOS device in the second portion 1004. Moreover, an inactive gate 1018', gate dielectric 1020', and spacers 1024' may be formed over or along a portion of device portions 1002 and 1004. The gate 1018' may be formed over at least part of the doped second region 1008 of the first device portion 1002. The spacers 1024' may be adjacent to the gate 1018' and be overlying at least part of the first device portion 1002 and/or at least part of the second device portion 1004, wherein regions 1022' and 1026 and 1028 that are underlying the spacers 1024' are less doped, but of the same doping type, than the first region 1006 or third regions (1010, 1016) of the first and second device portions (1002, 1004).

According to the implementation shown in FIG. 10, current that might otherwise leak between, for example, the doped third region 1010 (or the doped first region 1006) of the first portion 1002 and the doped third region 1016 of the second portion 1004 may be reduced. It will appreciated that certain previously described or otherwise known details, such as any underlying substrate material(s), are not shown in FIGS. 10A-C for the sake of simplicity. Moreover, it will also be appreciated that, although only a single device 1000 is shown, the device may be configured as part of an array, similar to device 400 or 500 with each base region 1008 having formed thereupon an inactive gate and spacers.

Exemplary Process

Figure 11:
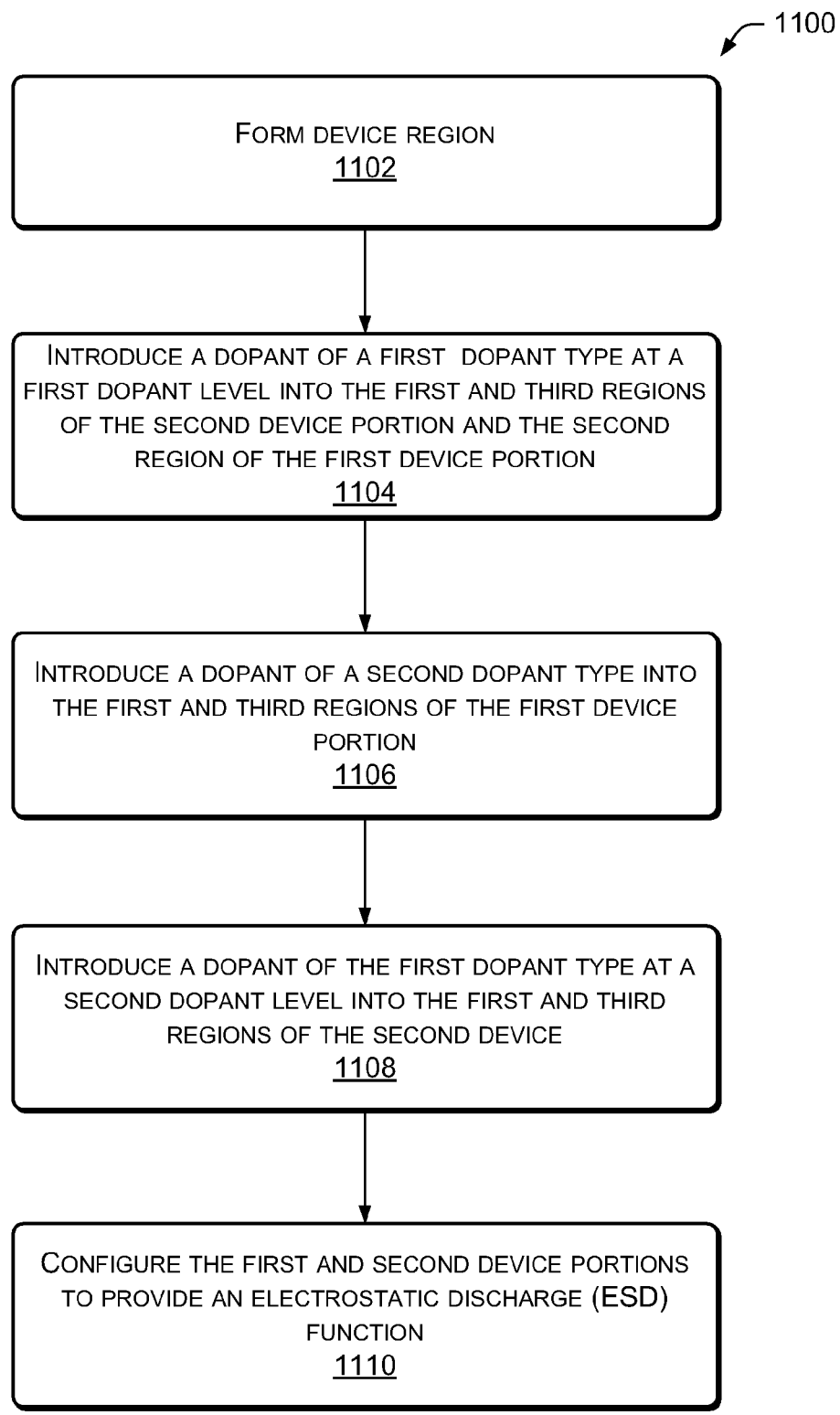
FIG. 11 is a flow diagram of a process for forming a device having a first device portion coupled to a second device portion.

FIG. 11 shows one example implementation of a process 1100 for forming a device, such as a device for ESD protection.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

The system in FIG. 1 may be used for reference in describing one aspect of the method 1100.

At 1102, a device region is formed. The device region having first and second device portions, each portion having first, second and third regions. According to the example shown in FIG. 1, the semiconductor material used to form device 100 may be formed on an insulating material layer 126. The semiconductor material may be etched to form a fin, as shown in FIG. 3, thus forming a FinFET-type structure.

At 1104, a dopant of a first dopant type at a first level may be implanted into the first and third regions of the second device portion and the second region of the first device portion. For example, the first and third regions (106 and 110) of the first device portion 102 and the second region 114 of the second device portion 104 may be masked to allow a dopant (e.g. n⁻) to be introduced into the first and third regions (112 and 116) of the second device portion 104 and the second region 108 of the first device portion 102. A patterned gate layer 118 and gate dielectric layer 120 may be provided to mask the second region 114 of the second device portion 104.

At 1106, a dopant of a second dopant type may be introduced into the first and third regions of the first device portion. For example, the second device portion 104 and second region 108 of the first device portion 102 may be masked to allow a p-type dopant (e.g. p⁺) to be implanted into the first and third regions 106 and 110 of the first device portion 102. Moreover, spacers 124 may be formed prior to the introduction of the dopant of the second dopant type.

At 1108, a dopant of the first dopant type at a second level may be introduced into the first and third regions of the second device. For example, the first device portion and the second region of the second device portion may be masked to allow an n-type dopant (e.g. n⁺) to be implanted into the first and third regions (112 and 116) of the second device portion 104. The second region may be masked with gate 118, gate dielectric 120, and spacers 124. The gate 118 and gate dielectric 120 may be formed according to known techniques prior to the n⁻ implant. The spacers 124 may be formed according to known techniques after the n⁻ implant. Of course, the gate 118, gate dielectric 120, and spacers 124 may alternatively be formed according to known techniques after the implantation steps have been completed. Moreover, the inactive gate 1018' and gate dielectric 1020' may also be formed according to known techniques prior to the n⁻ and/or the n⁺ implant and/or the p⁺ implant. The spacers 1024' may be formed according to known techniques after the n⁻ implant, but before the n⁺ and p⁺ implants.

It will be appreciated by one skilled in that art that that the step described at 1108 may be performed prior to the step described at 1106. In other words, the dopant of the first dopant type at the second level may be introduced prior to the dopant of the second dopant type being introduced.

At 1110, the first and second device portions may be configured to provide an ESD function or other suitable functionality. For example, as shown with regard to FIGS. 1A-C and FIG. 2, the second device portion (104 or 204), may be configured to trigger the first device portion (102 or 202). The first device portion (104 or 204) may be controlled by an RC component, such as RC component 206, or other suitable control circuit.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

We claim:

1. A device comprising:
   a first device portion including a doped first region, a doped second region and a doped third region, wherein the first device portion is a bipolar device portion; and
   a second device portion including a doped first region, a doped second region and a doped third region, wherein:
   the second device portion is a field effect transistor (FET) device portion,
   the doped third region of the second device portion is differently doped than the doped second region of the first device portion; and
   the first device portion is coupled to the second device portion only through a direct coupling of the doped second region of the first device portion to the differently doped third region of the second device portion.

2. The device as recited in claim 1, wherein:
   the doped first region of the first device portion is configured to operate as an emitter region,
   the doped second region of the first device portion is configured to operate as a base region, and
   the doped third region of the first device portion is configured to operate as a collector of the bipolar device portion.

3. The device as recited in claim 1, wherein:
   the FET device portion is configured to trigger the bipolar device portion and, together with the bipolar device portion, to provide a silicon controlled rectifier (SCR) function.

4. The device as recited in claim 2, wherein:
   the first device portion is a PNP bipolar transistor device, the second device portion is an n-type Metal Oxide Semiconductor Field Effect Transistor (n-MOSFET) device,
   the doped first region of the n-MOSFET portion is configured to operate as a source region,
   the doped second region of the n-MOSFET portion is configured to operate as a channel region, and
   the doped third region of the n-MOSFET portion is configured to operate as a drain region.

5. The device as recited in claim 1, wherein the first device portion and the second device portion are formed in a bulk silicon substrate or a silicon on insulator substrate.

6. The device as recited in claim 1 wherein the first device portion and the second device portion are patterned as a FinFET-type device.

7. The device as recited in claim 1, wherein:
   the first device portion further comprises a fourth region and a fifth region,
   the device further comprises a third device portion that includes a doped first region, a doped second region and a doped third region,
   the third device portion is configured to operate as a field effect transistor (FET) device, and
   the doped third region of the third device portion is coupled to the doped fourth region of the first device portion.

8. The device as recited in claim 7, wherein a common gate is coupled to the doped second regions of the second and third device portions.

9. The device as recited in claim 8, further comprising a fourth device portion configured to operate as an additional bipolar device portion and having a base region coupled to the doped second region of the first device portion by a base connection region.

10. The device as recited in claim 2, wherein the first device portion further comprises a doped fourth region configured to operate as an additional emitter or additional collector region.

11. The device as recited in claim 2, wherein the first device portion further comprises doped regions between the base region and the emitter region and between the base region and the collector region, such regions being less doped than the emitter or collector regions.

12. The device as recited in claim 1, wherein the doped second region of the first device portion has a surface that extends beyond a surface of the doped third region of the second device portion.

13. The device as recited in claim 1, wherein the doped second region of the first device portion and the doped third region of the second device portion are less doped than the doped first region of the second device portion.

14. The device as recited in claim 1, further comprising a gate material overlying at least part of the doped second region of the first device portion and spacers adjacent to the gate and overlying at least part of the first device portion and at least part of the second device portion, wherein regions underlying the spacers are less doped than the doped third region of the first device portion or the doped third region of the second device portion.

15. A device comprising:
   a bipolar device portion having a plurality of emitter regions, a plurality of base regions and at least one collector;
   a first field effect transistor (FET) device portion including a source region, a channel region, a drain region, and a single gate region; and
   a second FET device portion including a doped first region, a doped second region, a doped third region, and a single gate region;
   wherein each of the drain regions of the first and second FET devices is coupled to one of the plurality of base regions of the bipolar device portion to form an Isolated Gate Bipolar Transistor device.

16. The device as recited in claim 15, wherein:
   the bipolar device portion is a first bipolar device portion,
   the device further comprises a plurality of second bipolar device portions, each having a plurality of emitter regions, a plurality of base regions and at least one collector, and each of the plurality of base regions of the plurality of second bipolar device portions is coupled to one of the plurality of base regions of the first bipolar device portion.

17. A method comprising:

forming a device region, the device region having first and second device portions, each device portion having first, second and third regions;

introducing a dopant of a first dopant type at a first dopant level into the first and third regions of the second device portion and the second region of the first device portion;

introducing a dopant of a second dopant type into the first and third regions of the first device portion;

introducing a dopant of the first dopant type at a second dopant level into the first and third regions of the second device portion; and configuring the device portions to provide an electrostatic discharge (ESD) function by coupling the third region of the second device portion to the second region of the first device portion such that the first and second device portions are coupled only through the coupling of the third region of the second device portion to the second region of the first device portion.

18. The method as recited in claim 17, wherein forming the device region comprises:

forming a semiconductor layer on an insulating layer; and etching the semiconductor layer to form a raised fin region.

19. The method as recited in claim 17, further comprising:

forming a gate dielectric and a gate material over the second region of the second device portion prior to introducing any dopants.

20. The method as recited in claim 17, further comprising:

forming a gate dielectric layer and a gate material layer over the second region of the first device portion prior to introducing the dopant of the second dopant type at the second dopant level.

21. The method as recited in claim 20, further comprising:

forming spacers adjacent to the gate dielectric layer and the gate material layer prior to introducing the dopant of the second dopant type and the dopant of the first dopant type at the second dopant level.

* * * * *